United States Patent [19]

Suzuki

[11] Patent Number: 4,479,052

[45] Date of Patent: Oct. 23, 1984

[54] AVALANCHE PHOTO-DIODE BIAS CIRCUIT

[75] Inventor: Shinichi Suzuki, Tokyo, Japan

[73] Assignee: Asahi Kogaku Kogyo Kabushiki Kaisha, Tokyo, Japan

[21] Appl. No.: 411,079

[22] Filed: Aug. 24, 1982

[30] Foreign Application Priority Data

Aug. 31, 1981 [JP] Japan .................. 56-136658

[51] Int. Cl.³ ............................................. H01J 40/14
[52] U.S. Cl. .............................. 250/214 R; 307/297; 307/311
[58] Field of Search .............. 250/214 R; 307/296 R, 307/297, 311

[56] References Cited

U.S. PATENT DOCUMENTS

| | | | |
|---|---|---|---|
| 3,911,268 | 10/1975 | Mori et al. | 250/214 R X |
| 4,001,614 | 1/1977 | Dahlinger | 307/297 X |
| 4,181,863 | 1/1980 | Parker | 307/311 |
| 4,438,348 | 3/1984 | Casper et al. | 307/311 X |

Primary Examiner—Edward P. Westin
Attorney, Agent, or Firm—Sughrue, Mion, Zinn, Macpeak & Seas

[57] ABSTRACT

An avalanche photo-diode bias circuit compensates for temperature variations in the breakdown voltage by controlling the bias voltage so that the ratio of the bias voltage to the breakdown voltage remains constant, to achieve a constant current amplification factor.

5 Claims, 1 Drawing Figure

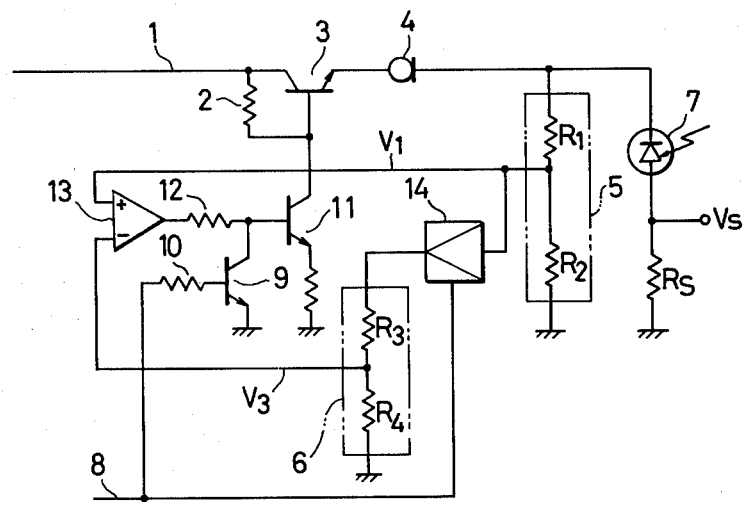

AVALANCHE PHOTO-DIODE BIAS CIRCUIT

BACKGROUND OF THE INVENTION

This invention relates to a bias circuit for an avalanche photo-diode which is employed as a light receiving element in a light receiving device in which light receiving and pause times occur repeatedly.

An avalanche photo-diode (hereinafter referred to merely as an "APD") operates to amplify, with a bias voltage, a photoelectric current $I_P$ obtained through photo-electric conversion, and the current amplification factor $\mu$ representing the degree of amplification thereof is, in general, expressed by the following equation:

$$\mu = \frac{1}{1 - \left(\frac{V_A}{V_B}\right)^n} \quad (1)$$

where $V_A$ is the bias voltage, $V_B$ is the breakdown voltage, and n is a constant between one and three, and where $V_A < V_B$.

It is essential for the light receiving device to have a stable current amplification factor $\mu$ excellent in S/N ratio. Furthermore, as the breakdown voltage $V_B$ has a positive temperature coefficient, it is necessary to maintain the factor $\mu$ constant against the variation of the breakdown voltage $V_B$ and to obtain a bias voltage $V_A$ which is stable. A light receiving device in which light receiving and pause times occur repeatedly may employ a method in which the APD breakdown voltage $V_B$ is detected by utilization of the pause time, and where the bias voltage $V_A$ in the light receiving time is set according to the voltage $V_B$ thus detected. In setting the bias voltage $V_A$ according to this method, it is essential that the variation in the breakdown voltage $V_B$ of the avalanche photo-diodes and the variation in the temperature characteristic of the breakdown voltages $V_B$ be corrected to thereby set the bias voltage with which the current amplification factor $\mu$ is made constant. In addition, it is necessary for the circuitry for this function to be simple, and the number of means for adjusting the fluctuating characteristics of the avalanche photo-diodes be minimized.

SUMMARY OF THE INVENTION

Thus, an object of this invention is to provide a non-adjusting bias circuit which is simple in arrangement, and which is capable of ensuring a constant current amplification factor.

BRIEF DESCRIPTION OF THE DRAWINGS

The single drawing FIGURE is a circuit diagram showing one embodiment of this invention.

DETAILED DESCRIPTION OF THE PREFERRED EMBODIMENTS

In FIG. 1, reference numeral 8 designates a signal line for the input of a sample pulse. The sample pulse is output on the signal line by a control circuit (not shown), such as a computer, in synchronization with the start of a pause time. The sample pulse signal line 8 is connected to a sample and hold circuit 14, and to a switching transistor 9 through a base resistor 10. When the sample pulse is raised to a high logical level, the sample and hold circuit is placed in the sample state, and the transistor 9 is rendered conductive as the sample pulse is applied thereto through the base resistor 10. The collector of the transistor 9 is connected to the base of a driving transistor 11. Therefore, when the transistor 9 is rendered conductive, the transistor 11 is rendered non-conductive. The collector of the transistor 11 is connected to the base of a transistor 3 for voltage control. Accordingly, when the transistor 11 is rendered non-conductive, the transistor 3 is rendered conductive by a base current through a base resistor 2. The emitter of the transistor 3 is connected to a constant current diode 4. The constant current diode 4, an APD 7, a photo-electric signal detecting resistor $R_S$ connected to the APD 7, and breakdown voltage detecting resistors $R_1$ and $R_2$ forming a voltage divider circuit 5 are connected to one another such that, when the transistor 3 is conductive, the constant current of the constant current diode 4 flows to the APD 7 and the resistor $R_S$, and to the resistors $R_1$ and $R_2$. If the resistance of the resistors $R_1$ and $R_2$ is set to a value much higher than the impedance $Z_B$ of the APD 7 involved at the time of breakdown, then the larger part of the current flows to the detecting resistor $R_S$ connected to the APD 7. The voltage $V_S$ developed across the photo-electric signal detecting resistor $R_S$ during light reception is introduced, as a signal voltage, to a signal processing circuit (not shown). The constant current diode is selected so that the constant current is large enough to develop the breakdown voltage of the APD 7. Instead of the constant current diode, a conventional constant current circuit including a field-effect transistor may be employed. In this case, the voltage across the detecting resistors $R_1$ and $R_2$ is the sum of the breakdown voltage $V_B$ of the APD 7 and the voltage $V_S$ developed across the detecting resistor $R_S$ by the constant current. As the resistance of the detecting resistor $R_S$ is set so that $V_B > V_S$, $V_S$ can be disregarded, and the voltage $V_1$ across the detecting resistors $R_1$ and $R_2$ becomes the breakdown voltage $V_B$. The breakdown voltage $V_B$ is divided by the detecting resistors $R_1$ and $R_2$ to provide $$V_1 = \frac{R_2}{R_1 + R_2} V_B.$$

The voltage $V_1$ is applied to the sample and hold circuit 14.

Therefore, when the sample and hold circuit is in the sample state, the voltage $$\frac{R_2}{R_1 + R_2} V_B,$$

being sampled, is applied to the output of the sample and hold circuit. When the sample pulse is set to the low logical level, the voltage $$\frac{R_2}{R_1 + R_2}$$

$V_B$ is stored in the sample and hold circuit 14. The voltage delivered to the output of the sample and hold circuit is then applied to bias constant resistors $R_3$ and $R_4$ forming a voltage divider circuit 6 which is connected to the output of the sample and hold circuit.

The connecting point of the detecting resistors $R_1$ and $R_2$ and the connecting point of the bias constant resistors R₃ and R₄ are connected to input terminals + and − of a comparison amplifier 13, respectively, so that a voltage $V_3$ provided by the bias constant resistors R₃ and R₄ and the voltage $V_1$ provided by the detecting resistors R₁ and R₂ are applied to the comparison amplifier 13.

As was described before, when the sample pulse is set to the low logical level, the transistor 9 is rendered non-conductive, and the transistors 11 and 3 become active. Accordingly, the divided voltage $V_1$ provided by the detecting resistors R₁ and R₂ when the transistor 3 is active is compared with the voltage $V_3$ (the reference voltage) which is provided by dividing the voltage stored and outputted by the sample and hold circuit 14 via the resistors R₃ and R₄. The difference voltage is amplified and is then applied through a base resistor 12 to the transistor 11 to control the collector current thereof and thereby control the base voltage of the transistor 3, so that a constant voltage is applied at the emitter of the transistor 3.

As is apparent from the above description, the transistors 9 and 11 form a switch circuit through which the output of the comparison amplifier is selectively applied as a control voltage to the voltage-controlled transistor 3.

The constant voltage provided at the emitter of the transistor 3 is the bias voltage $V_A$ of the APD 7, and its balance condition is:

$$V_1 = \frac{R_2}{R_1 + R_2} V_A = \frac{R_4}{R_3 + R_4} \left( \frac{R_2}{R_1 + R_2} V_B \right) = V_3 \quad (2)$$

Therefore $$V_A = \frac{R_4}{R_3 + R_4} V_B$$

The bias voltage $V_A$ will never become higher than the breakdown voltage $V_B$. During biasing, the behavior of the constant current diode 4 is such that the impedance of the APD 7 becomes high, and the value of the current flowing in the constant current diode 4 becomes smaller than the constant current value of the constant current diode 4, i.e., the constant current diode 4 becomes merely conductive, thus not affecting the constant voltage control operation. In FIG. 1, reference numeral 1 designates a line from a high voltage source circuit (not shown). The high voltage, being controlled by the transistor 3, is applied as the bias voltage to the APD 7.

As was described before, the current amplification factor $\mu$ is represented as follows:

$$\mu = 1/(1 - K^n)$$

where $K = V_A/V_B$

Therefore, if $V_A/V_B = K$ is constant, then $\mu$ is also constant. In the case of the invention, from the above description, $V_A/V_B = R_4/(R_3 + R_4)$, so that $R_4/(R_3 + R_4)$ corresponds to the constant K.

Therefore, the necessary current amplification factor $\mu$ can be obtained by setting the resistance ratio of the bias constant resistors R₃ and R₄ to a suitable value. If the constant K is so determined, it is unnecessary to individually adjust avalanche photo-diodes of different breakdown voltage, and the current amplification factor $\mu$ can be maintained constant against the temperature variation of the breakdown voltage $V_B$.

As is apparent from the above description, the employment of the circuit arrangement according to the invention can provide a non-adjusting bias circuit for avalanche photo-diodes which fluctuate in characteristics, although the circuitry is simple. Thus, the effect of the invention should be highly appreciated.

What is claimed is:

1. An avalanche photo-diode bias circuit for a light receiving device having light-receiving and pause times and an avalanche photo-diode employed as a light receiving element, comprising; a voltage-controlled transistor (3) connected through constant current means (4) to said avalanche photo-diode; a first voltage divider circuit (5) connected to said constant current means (4); a sample/hold circuit (14) controlled by a sample pulse during a pause time for receiving an output of said voltage divider circuit (5); a second voltage divider circuit (6) connected to an output of said sample/hold circuit; means (13) for comparing an output of said second voltage divider circuit (6) with an output of said first voltage divider (5); and switching means controlled by said sample pulse for selectively applying an output of said comparing means, as a control voltage, to said voltage-controlled transistor (3).

2. An avalanche photo-diode bias circuit as claimed in claim 1, wherein said constant current means comprises a field-effect transistor.

3. An avalanche photo-diode bias circuit as claimed in claim 1, wherein said constant current means comprises a constant current diode.

4. An avalanche photo-diode bias circuit as claimed in claim 1, said switching means including a transistor group receiving said sample pulse and an output of said comparing means.

5. A avalance photo-diode bias circuit as claimed in claim 1, a bias voltage of said avalanche photo-diode being varied according to the breakdown voltage thereof and resistances in said second voltage divider.

* * * * *